United States Patent [19]

Braun et al.

[11] Patent Number: 4,987,478
[45] Date of Patent: Jan. 22, 1991

[54] MICRO INDIVIDUAL INTEGRATED CIRCUIT PACKAGE

[75] Inventors: Robert E. Braun, Norristown; Ronald T. Gibbs, King of Prussia, both of Pa.

[73] Assignee: Unisys Corporation, Blue Bell, Pa.

[21] Appl. No.: 481,252

[22] Filed: Feb. 20, 1990

[51] Int. Cl.⁵ .................... H01L 23/02; H01L 23/12; H01L 39/02; H01L 23/42

[52] U.S. Cl. ........................... 357/81; 357/74; 357/80; 357/79

[58] Field of Search .................. 357/81, 74, 79; 361/381, 386, 389

[56] References Cited

U.S. PATENT DOCUMENTS

| | | | |
|---|---|---|---|
| 3,437,883 | 4/1969 | Smith | 317/101 |
| 4,034,468 | 7/1977 | Koopman | 29/628 |
| 4,092,697 | 5/1978 | Spaight | 361/386 |
| 4,338,621 | 7/1982 | Braun | 357/74 |
| 4,479,140 | 10/1984 | Horvath | 357/81 |
| 4,612,601 | 9/1986 | Watari | 361/387 |
| 4,744,007 | 5/1988 | Watari et al. | 361/386 |
| 4,868,638 | 9/1989 | Hirata et al. | 357/72 |

FOREIGN PATENT DOCUMENTS

| | | | |
|---|---|---|---|
| 0051553 | 3/1984 | Japan | 357/81 |
| 0103649 | 6/1985 | Japan | 357/81 |
| 0185957 | 7/1989 | Japan | 357/81 |

Primary Examiner—Rolf Hille
Assistant Examiner—David Ostrowski
Attorney, Agent, or Firm—Mark T. Starr; Thomas J. Scott

[57] ABSTRACT

An hermetic integrated circuit package having a single die wherein wire connections to area pads on the active face of the die are carried through an hermetic boundary comprised of a cover plate to an external interface with the next succeeding interconnect level. The package is comprised of a heat exchange element to which the die is attached, a cover plate having holes homologously positioned with respect to the area pads on the die and a seal ring for joining the heat exchange element to the cover plate. The wire connections which are carried through the holes and sealed to the cover plate are externally accessible.

12 Claims, 2 Drawing Sheets

MICRO INDIVIDUAL INTEGRATED CIRCUIT PACKAGE

BACKGROUND OF THE INVENTION

Technological advances such as those presently occurring in logic design, are dependent upon the availability of hermetic semiconductor packages having a high input/output terminal density, and being capable of high power dissipation. Logic chips or die packaged in hermetic single chip packages have historically been the basic element in the design of most electrical equipment. All of the single chip packages that are commercially available utilize a logic die that has its input/output connections made to signal pads disposed along the die periphery. These peripheral pads are connected by wire bonding or Tape Automated Bonding (TAB) to a substrate which fans out to peripheral leads on a larger pitch or to an array of area pins on the substrate. For a high power area pin package, the package size is often increased to provide for thermal conduction through the back of the die. Effectively, all single chip packages available today utilize leads on the edge of the die and fan out to a larger pitch for the next level of interconnect resulting in decreased chip density and increased load capacity.

In the development of high performance digital computers, a multichip approach has been utilized wherein a number of non-hermetic, bare die have been connected in an assembly that is enclosed by a unitary hermetic cover. This multichip assembly provides higher performance than single chip packaging by reducing interconnect lengths and chip input capacity. However, the multichip approach requires a sophisticated assembly process and has a significant disadvantage in that repair to any of the multiplicity of die connections is difficult to effect.

What is desired is a hermetic single chip package that allows the spacing among a plurality of chips to be substantially equivalent to that provided by the multichip organization and at the same time has a low input capacity. The present micro integrated circuit package fills such a need.

SUMMARY OF THE INVENTION

The basic concept of the present invention is to carry connections made to signal pads disposed on the surface of a logic chip or die, through a hermetic boundary to provide a ruggedized and repairable or replaceable connection to the next interconnect level. The interface for this connection may be a direct solder bump or an extended wire or pin to compensate for differential expansion depending upon the interconnect media.

The present micro package is implemented by bonding wires respectively to area pads on the logic die. The technique of area pad connection to logic die is well known for multichip configurations, but has not been used to provide high density in-line connections for single chip packages, as envisioned by the present invention. The die is then back attached to a heat exchange element formed of a material that closely matches the coefficient of expansion of the silicon die. A dielectric cover plate with holes formed therein that are homologously disposed with respect to the pin locations, are joined to the heat exchanger element by way of a seal ring. The cover plate which is formed of material with substantially the same expansion characteristics as the chip, includes metallized hole walls with pads on both its inner and outer surfaces. A high temperature solder is added or reflowed to connect the pins to the cover plate and thus form an hermetic seal.

It is apparent from the foregoing description that the micro package of the present invention is only slightly larger than the die itself. Thus, a very close spacing of the packages is possible. In the latter circumstance, considering high speed logic, a very high thermal density is created. In order to dissipate the heat generated within the individual package, the heat exchange element is preferably of the microfin variety. The microfin cooling approach has been the subject of academic investigation, such as the Tuckerman Pease-Stanford study. The microfin concept lends itself to a sealed forced convection cooling system or an immersion cooling system. Such an arrangement solves the thermal density problem which has been one of the most difficult and limiting factors in conventional multi chip designs. The present package is also applicable to lower power applications, in which case more conventional air-cooled heat exchangers with larger fins may be substituted for the microfins.

Other features and advantages of the present invention will become apparent in the detailed description which follows.

DESCRIPTION OF THE PREFERRED EMBODIMENTS

Figure 1:
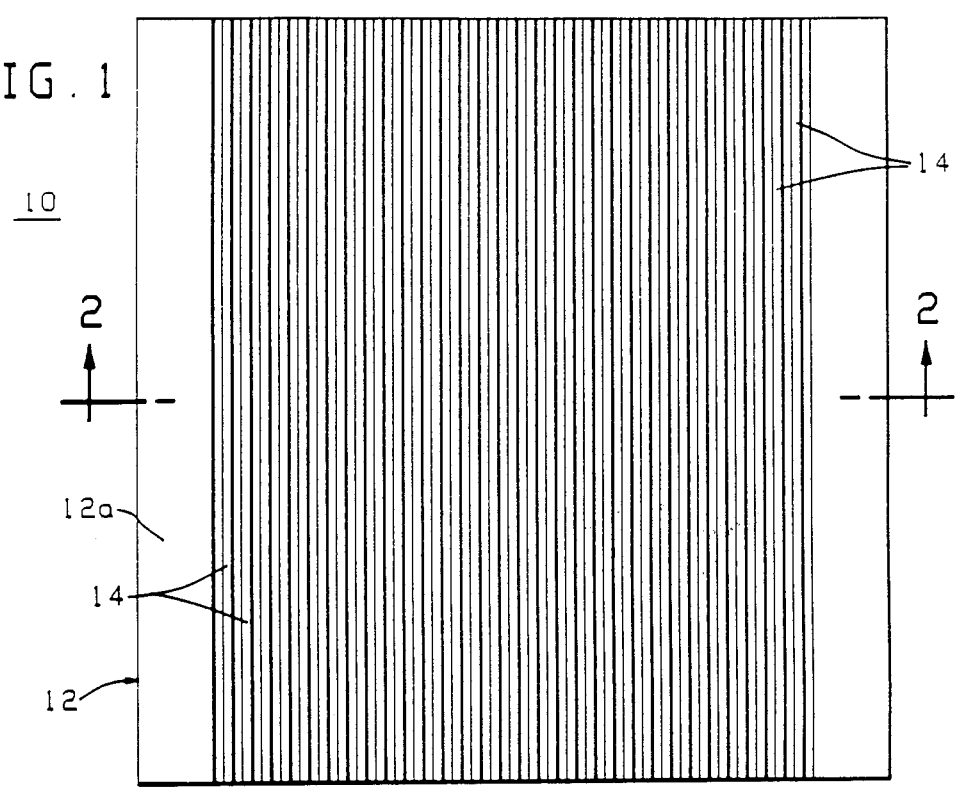
FIG. 1 is a plan view of the present integrated circuit package illustrating particularly the heat exchange element.

In FIG. 1, the plan view of the package 10 illustrates the outer surface 12a of the heat exchange element 12 which includes cooling fins 14.

Figure 2:
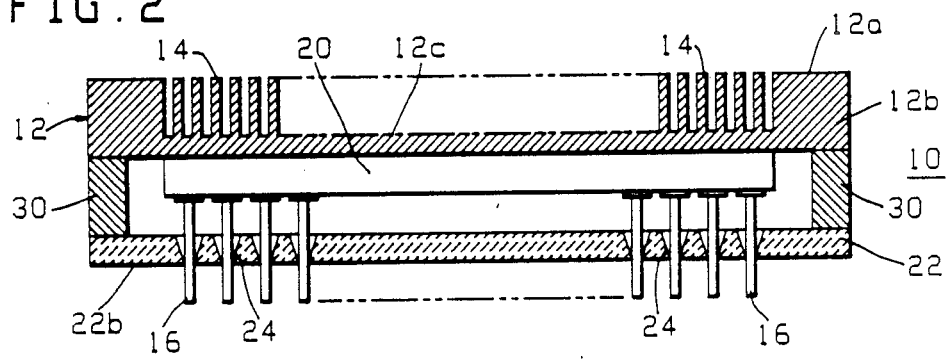
FIG. 2 is a section view taken along the lines 2—2 of FIG. 1 showing the relationship of the elements which comprise the assembled package.
Figure 2A:
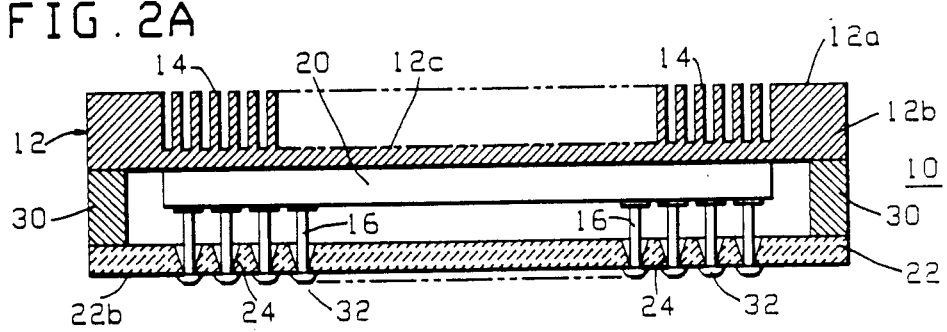
FIG. 2A is a section view similar to that of FIG. 2 but illustrating an alternate configuration of the input/output elements.
Figure 3:
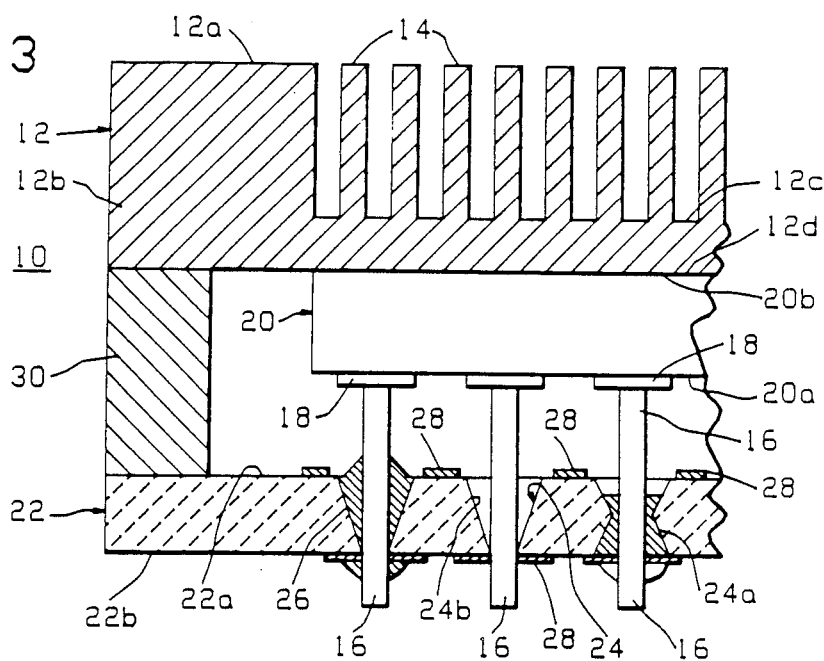
FIG. 3 is an enlargement of a portion of the section view of FIG. 2 showing the sealing of the pins in the cover plate to achieve package hermeticity.

FIG. 2 illustrates the assembled micro package of the present invention. With reference to FIGS. 2 and 3, the heat exchange element 12 is comprised of a U-shaped section 12b having a recess 12c which accommodates the cooling fins 14. A plurality of wires or pins 16, made for example, of gold, are thermocompression bonded to signal pads 18 distributed over the active front surface 20a of the die 20. The back surface 20b of the die 20 is eutectically attached to the inner surface 12d of the heat exchange element 12. Thus, the die is mounted in proximity to the recess 12c in the heat exchange element 12 which contains the cooling microfins 14. The heat exchange element 12 is formed of a material such as silicon carbide or aluminum nitride which closely matches the thermal coefficient expansion of the die 20. A dielectric cover plate 22 is provided. A plurality of holes 24 as best seen in FIG. 3, are formed in the cover plate such as by etching, hole 24a, or laser drilling, hole 24b. The placement of the holes 24 corresponds to the wire locations on the surface 12a of the die. The cover plate 22, like the heat exchange element 12, is formed of material which is compatible with the thermal expansion characteristics of the die. The holes 24 in the cover plate have metallized walls 26 with solder mask and preform pads 28 on the inner and outer surfaces, 22a and 22b respectively, of the plate 22. A seal ring 30 formed for example of molybdenum, is sealed to the respective peripheries of the heat exchange element 12 and the cover plate 22 by high temperature solder. The wires 16 are sealed to the cover plate 22 by a high temperature solder such as tin-gold which is added or reflowed, thereby forming an hermetic seal. As seen by way of example in FIG. 2, the wires 16 may protrude from the cover plate to effect interface connections or alternately, as in FIG. 2A, they may be severed adjacent the outer surface 22b of the cover plate 22 and a solder bump 32 deposited in contact with each wire extremity. After cutting the wires to the desired length, the ends are processed in a manner such that all ends are coplanar.

It is apparent that the number of input/output elements is dependent upon the pitch of such elements and the physical size of the die. However, the following specific implementation of the present micro package will demonstrate its viability in a real system environment.

Figure 4:
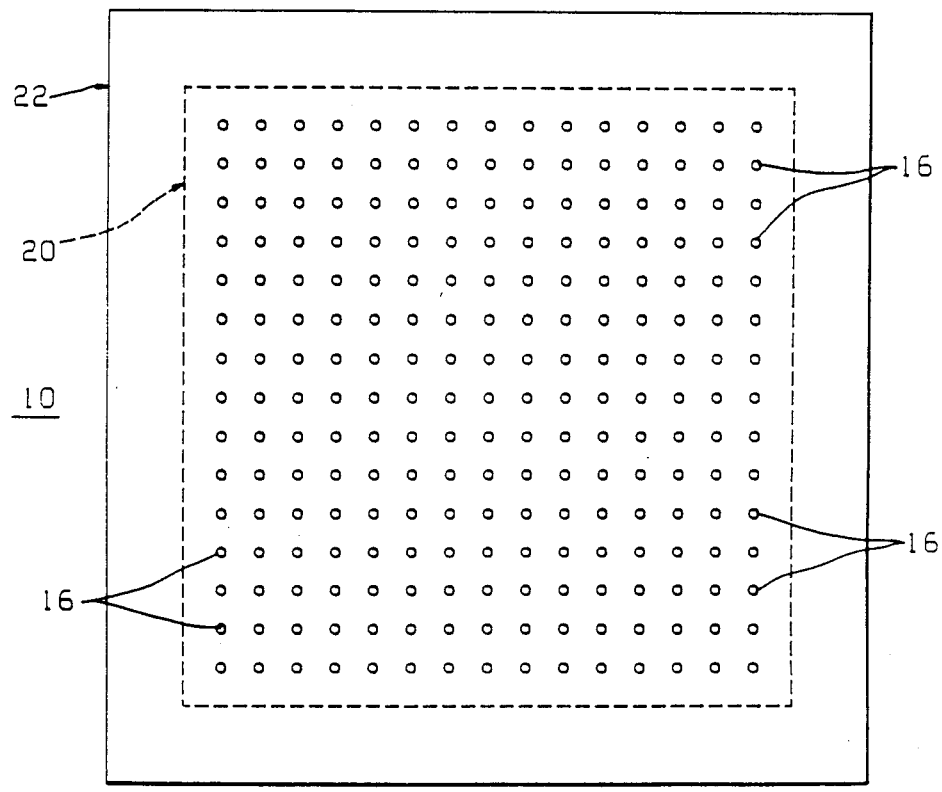
FIG. 4 is a bottom view of the present package illustrating a plurality of input/output elements and providing an indication of the relative sizes of the die and the overall package.

The silicon technology field has projected densities of 100,000 gates on a 0.500=0.500 chip with 300 to 400 signal pins and a power dissipation of 50 watts, resulting from a current of 10 amps at 5.0 volts. A number of additional power pins are required to support this high current. If a 20 mil pad array pitch is used on the die, 576 pin outs would result. In this case, as represented in FIG. 4, the micro package would be 0.580 inches square. Testing and analysis have shown that 4 mil thick microfins on an 8 mil pitch with a 30 mil height can provide thermal resistance in the range of 0.6 to 0.8 degrees Centigrade per watt, which is adequate to cool this 50 watt die.

In conclusion, there has been disclosed a packaging technology which is consistent with the present state of the silicon chip art. The hermetic package of the present invention provides a housing for a single chip having high power dissipation and a large input/output pin count. It should be noted that the details of the assembly process of the package including the sealing materials and methods have been presented solely for purposes of example, and are not to be construed as limitative of the invention. Changes and modifications in the package and its assembly, which are well within the skill of the designer may be required to suit particular applications. Such changes and modifications, in so far as they are not departures from the scope of the invention, are intended to be covered by the claims which follow.

What is claimed is:

1. A micro hermetic single die integrated circuit package comprising:

a heat exchange element having an outer surface and an inner planar surface, a die having planar front and back surfaces, a plurality of area pads distributed in a predetermined configuration on the front surface of said die, a plurality of wires having inner and outer extremities, said inner extremities of said wires being bonded respectively to said area pads, said wires emanating orthogonally from said front surface of said die, the back surface of said die being attached to said inner planar surface of said heat exchange element, a cover plate having planar inner and outer surfaces, a plurality of holes formed in said cover plate, said holes being homologously positioned with respect to said plurality of area pads on said die, a seal ring attached to the respective peripheries of the inner surfaces of said heat exchange element and said cover plate, said outer extremities of said wires being disposed within said holes and being accessible at the outer surface of said cover plate, and means for sealing said wires to said cover plate, thereby effecting an hermetic package.

2. A micro package as defined in claim 1 wherein said outer surface of said heat exchange element includes a multiplicity of parallel, spaced-apart cooling fins.

3. A micro package as defined in claim 2 characterized in that said heat exchange element has a substantially U-shaped cross section, said cooling fins being disposed in the recess defined by the outer surface of said element.

4. A micro package as defined in claim 3 wherein said cooling fins are of the microfin type.

5. A micro package as defined in claim 3 wherein said die is attached to said inner surface of said heat exchange element adjacent said recess.

6. A micro package as defined in claim 5 wherein said wires protrude from the outer surface of said cover plate.

7. A micro package as defined in claim 3 wherein said wires are terminated on said outer surface of said cover plate, and solder bumps being deposited in contact respectively with said wires.

8. A micro package as defined in claim 6 characterized in that said heat exchange element and said cover plate are each formed of material having substantially the same thermal coefficient of expansion as that of said die.

9. A micro package as defined in claim 8 wherein the wall surface of each of said holes in said cover plate is metallized.

10. A micro package as defined in claim 9 further characterized in that said means for sealing said wires to said cover plate include a solder mask and preform.

11. A micro package as defined in claim 10 wherein said seal ring is formed of molybdenum.

12. A micro package as defined in claim 11 wherein said wires are formed of gold.

* * * * *